United States Patent [19]

Zarowin

[11] Patent Number: 5,376,224

[45] Date of Patent: Dec. 27, 1994

[54] METHOD AND APPARATUS FOR NON-CONTACT PLASMA POLISHING AND SMOOTHING OF UNIFORMLY THINNED SUBSTRATES

[75] Inventor: Charles B. Zarowin, Rowayton, Conn.

[73] Assignee: Hughes Aircraft Company, Los Angeles, Calif.

[21] Appl. No.: 842,936

[22] Filed: Feb. 27, 1992

[51] Int. Cl.⁵ .................. H01L 21/306; B44C 1/22
[52] U.S. Cl. .................. 156/643; 156/639; 156/657; 156/662; 156/345
[58] Field of Search .......... 156/643, 646, 657, 662, 156/345, 903, 636, 637, 639; 427/38, 39; 118/720, 723, 729, 50.1, 620; 134/1, 31, 32; 204/192.32, 192.37, 298.31, 298.33, 298.35

[56] References Cited

U.S. PATENT DOCUMENTS

| | | | |
|---|---|---|---|
| 3,943,047 | 3/1976 | Cruzan et al. | 204/298.35 X |
| 4,523,907 | 3/1981 | Parry et al. | 156/643 |
| 4,668,366 | 5/1987 | Zarowin | 204/192.1 |
| 4,874,459 | 10/1989 | Coldren et al. | 156/643 |
| 4,874,460 | 10/1989 | Natagawa et al. | 156/626 |
| 4,964,940 | 10/1990 | Auvert et al. | 156/345 |
| 5,009,738 | 4/1991 | Gruewald et al. | 156/345 |
| 5,076,877 | 12/1991 | Ueda et al. | 204/298.33 X |

OTHER PUBLICATIONS

Jurgensen, Sheath Collision Processes Controlling The Energy And directionality of Surface bombardment in O₂ reactive ion etching, J. Appl. Phys. 64(2), 15 Jul. 1988, pp. 590–597.

Eisele of SiO₂ in a Narrowly Confined Plasma of High Power density, J. Vac. Sci. Technol. B4(5), Sep./Oct. 1986, pp. 1227–1232.

Primary Examiner—William A. Powell
Attorney, Agent, or Firm—M. E. Lachman; M. W. Sales; W. K. Denson-Low

[57] ABSTRACT

A plasma is used in conjunction with a plasma assisted chemical etching material removal tool 10 to rapidly and precisely polish and smooth a substrate without mechanically contacting the surface. The pressure of a process gas, which disassociates into reactive plasma species in the presence of an applied radio frequency field, is controlled so as to allow the selection of a primarily unidirectional or a primarily omnidirectional polishing and smoothing mechanism.

18 Claims, 3 Drawing Sheets

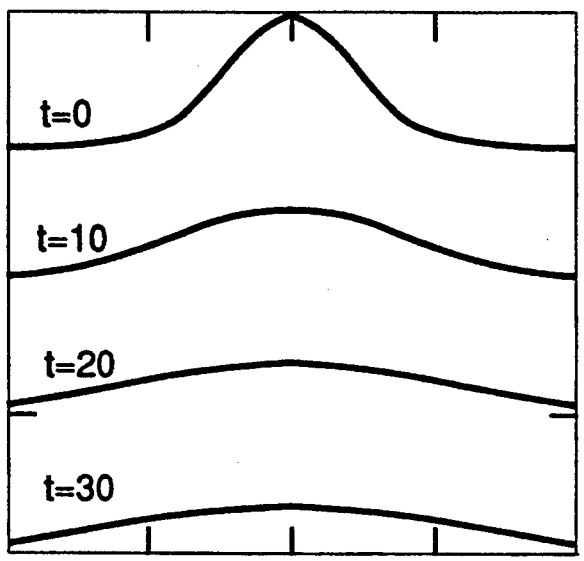
COMPUTER SIMULATION OF
CURVATURE DEPENDENT
UNIDIRECTETIONAL ETCH,
SHOWING SMOOTHING
FIG. 3.
FIG. 4.
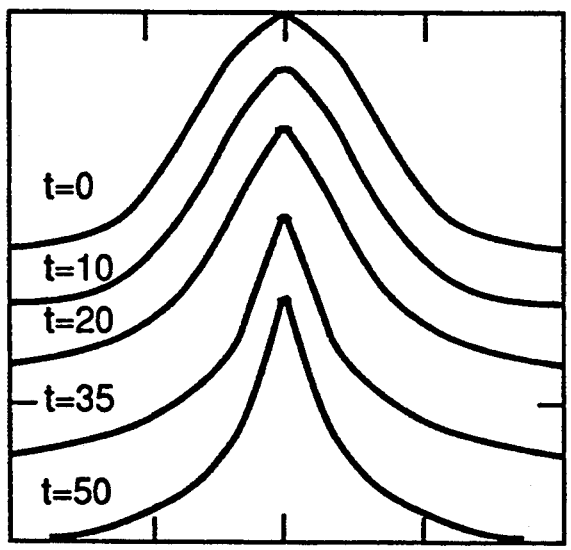
COMPUTER SIMULATION OF
CURVATURE DEPENDENT
UNIDIRECTETIONAL ETCH,
SHOWING SMOOTHING

METHOD AND APPARATUS FOR NON-CONTACT PLASMA POLISHING AND SMOOTHING OF UNIFORMLY THINNED SUBSTRATES

FIELD OF THE INVENTION

The present invention relates to a method and apparatus for smoothing thinned substrates, and more particularly to a method and apparatus for non-contact plasma polishing and smoothing of uniformly thinned substrates useful in the fabrication of silicon-on-insulator (SOD wafer structures.

DESCRIPTION OF THE PRIOR ART

Chemical-mechanical polishing is a useful method to polish the surface of a substrate. However, the chemical-mechanical polishing process mechanically contacts the surface of the substrate which leaves contaminants on the surface. Chemical-mechanical polishing, in some cases, also causes subsurface damage to the substrate.

Substrate surface processing, such as polishing, can be performed by non-contact methods such as plasma assisted chemical etching. Methods and apparatus for performing plasma assisted chemical etching are disclosed in U.S. patent application Ser. No. 07/696,897, filed on May 7, 1991, entitled "System For Removing Material From A Wafer", U.S. patent application Ser. No. 07/807,535, entitled "Methods and Apparatus for Confinement of a Plasma Etch Region for Precision Shaping of Surfaces of Substrates and Films", filed on Dec. 13, 1991, and U.S. patent application Ser. No. 07/807,536, filed on Dec. 13, 1991, entitled "Methods and Apparatus for Generating a Plasma for 'Downstream' Rapid Shaping of Surfaces of Substrates and Films." All of these patent applications are commonly owned by the present assignee.

SUMMARY OF THE INVENTION

The present invention is a method and apparatus for performing non-contact plasma polishing and smoothing of uniformly thinned substrates by a plasma assisted chemical etching material removal tool. By controlling the operating parameters of the plasma process, the material removal mechanism of the etching process can be controlled so as to provide a rapid and predictable smoothing process for polishing substrates such as silicon dioxide. A unidirectional material removal mechanism for smoothing can be obtained with the present invention by choosing a sufficiently high RF power density/gas pressure ratio which will ensure that ionic species of the etching process are controlled by the electric fields. On the other hand, an omnidirectional material removal mechanism can be obtained by choosing a lower RF power density/gas pressure ratio that ensures that the etching is dominated by plasma species (neutral or charged) that are essentially independent of the electric fields.

One objective of the present invention is to provide a method for polishing a uniformly thinned substrate Another objective of the present invention is to provide a method and apparatus for controllable and predictable non-contact plasma polishing of a uniformly thinned substrate.

Other objects and advantages of the present invention will become apparent to those skilled in the art from the following detailed description read in conjunction with the attached drawings and claims appended hereto.

BRIEF DESCRIPTION OF THE DRAWINGS

FIG. 3 is a computer simulated graphical illustration of the unidirectional smoothing mechanism of the present invention.

FIG. 4 is a computer simulated graphical illustration of the omnidirectional smoothing mechanism of the present invention.

DETAILED DESCRIPTION OF THE INVENTION

Figure 1:
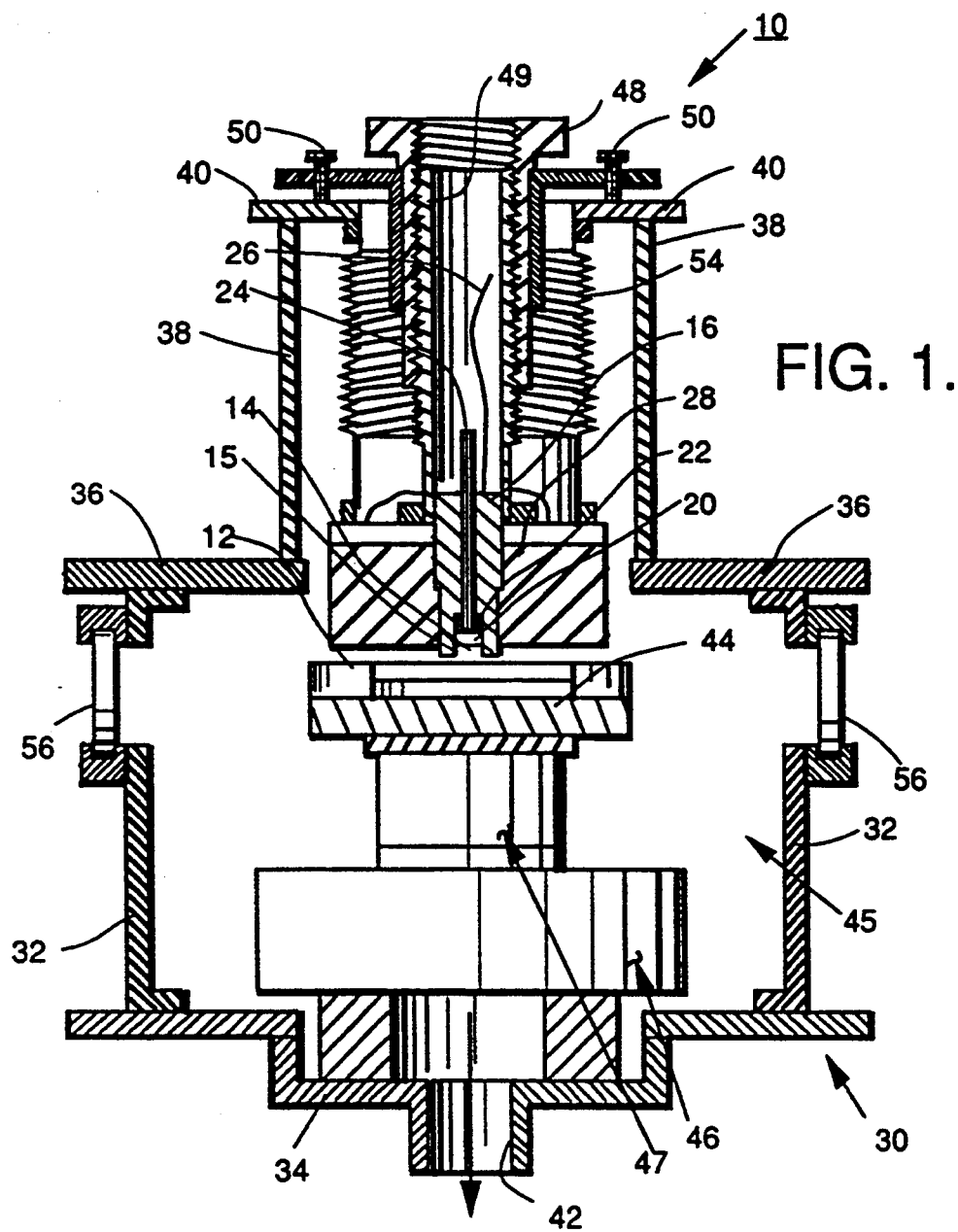
FIG. 1 is a schematic diagram of a reactor system capable of confining a plasma etch region to a local area on a substrate.

The method and apparatus of the present invention removes subsurface damage layers or other unwanted layers of semiconductor material by the application of reactive species of a plasma to the substrate by a plasma assisted chemical etching material removal reactor. FIG. 1 shows the plasma assisted chemical etching reactor apparatus used for subsurface damage removal of a substrate. Referring to FIG. 1, the apparatus is designed so as to confine a plasma etch region over a substrate. It comprises a reactor 10 designed for transposing a process gas into a region over the surface of a substrate where an rf field is applied to disassociate the gas into reactive components. (ions, electrons neutral atoms, and molecules) as a reactive plasma. To accomplish this desired result, the reactor 10 has a plasma chamber 14 having walls 15 defined by a first dielectric insulator 16 and a ceiling defined by a gas diffuser 20. The plasma chamber 14 is the center of etching reactivity and thus, the first dielectric must be fabricated from a non-contaminating material. Above the chamber 14, an rf driven electrode 22 is affixed between the diffuser 20 and the first insulator 16. A process gas feed tube 24 running centrally through the first dielectric insulator 16 supplies reactive gas to the diffuser 20 in the plasma chamber 14 during the etching operation. An rf inlet conductor 26 connects the rf driven electrode 22 to an rf field power source. A second dielectric insulator 28 surrounds the first insulator 16 and is dimensioned so as to essentially cover substrate 12 so as to prevent plasma formation outside of chamber 14. The components of the reactor 10, are enclosed in a vacuum housing 30 comprising a first set of walls 32 extending from a base 34 to a mid-ceiling 36 and a second set of walls 38 extending to a top ceiling flange 40.

During operation, a vacuum is applied through a vacuum outlet 42 at the bottom of the vacuum housing 30. The etchable substrate 12, located adjacently below the plasma chamber 14 during etching, is supported by a substrate holder 44 which also acts as a second electrode having its potential preferably at electrical ground. The substrate holder may also have a means (not shown) to control the temperature of the substrate thereon.

The substrate holder 44 is mounted to an apparatus 45 for two-dimensional translation such as an X-Y table which allows precise placement of the localized etching reaction on the surface of the substrate 12. The reactor 10 has a threaded tube 48 connected to a reactor support means 49 which interfaces with the threaded tube. The tube 48 may be rotated in a clockwise or counter clockwise fashion so as to allow adjustment of the distance between the plasma chamber 14 and the surface of the substrate 12. In the embodiment illustrated, the distance between the plasma chamber and the substrate may be adjusted in the approximate range of 1 to 10.

The reactor also has kinematic mounting means having three screws 50 equally spaced on a circle, each of which nest into a V-groove (not shown) on the top ceiling flange 40. This means allows adjustment of the angle of the terminal end 52 of the plasma chamber with respect to the surface of the substrate 12.

While the present embodiment described above provides a means for positioning the plasma chamber 14 with respect to the surface of the substrate 12, other adaptations such as permanently fixing the plasma chamber assembly and providing three-dimensional and multi-angular positioning of the substrate by three-dimensional and multi-angular translation stages may be readily substituted. One preferred embodiment has a fixed reactor configuration so that the rf power, gas and coolant to the plasma reactor can be easily interfaced at atmosphere.

The reactor system further comprises a bellows 54 attached between the ceiling flange 40 of the vacuum housing 36 and the second dielectric insulator 28 so as to provide a means for vacuum sealing the reactor 10 while the plasma chamber assembly is allowed relative movement within the reactor. A plurality of viewports 56 are provided for observation of the reaction.

Figure 2:
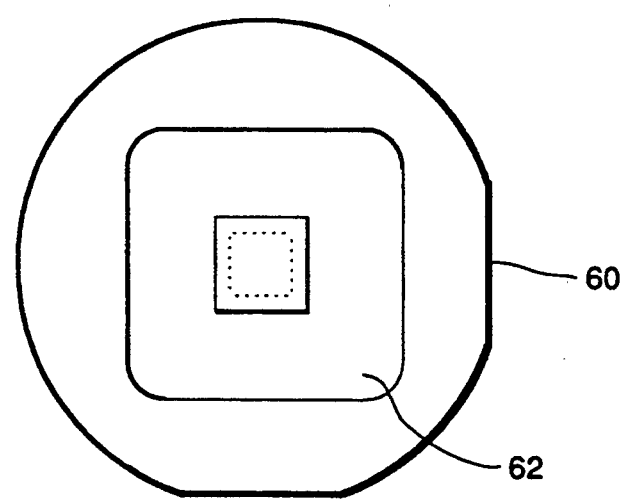
FIG. 2 is an illustration of a rough ground silicon wafer substrate after treatment by static plasma assisted chemical etching of a part of the surface under of the plasma and particularly illustrates the resulting specular surface where treated. The surrounding surface which was not treated provides a comparison between the pre-treatment surface and the post-treatment surface.

FIG. 2 illustrates that the surface of a rough ground silicon wafer substrate 60 becomes specular where treated by the static plasma etching of the surface 62. The specular surface results from unidirectional and/or omnidirectional static plasma etching mechanisms.

The surface of a substrate prior to treatment by the present invention, or any other smoothing process, has a plurality of microscopic "peaks" and "valleys" (the peaks and valleys have characteristic dimensions that are less than a plasma Debye length which is on the order of 1 mm). Smoothing or polishing processes in general are processes which reduce the amplitude of the "peaks" with respect to the "valleys". The reduction of amplitude of the "peaks" with respect to the "valleys" by plasma assisted chemical etching occurs by both unidirectional and omnidirectional mechanisms and the particular mechanism performing the reduction depends on the operating parameters of the plasma process.

When the etch process is unidirectional and controlled by the electric fields present in the plasma process, the etch rate at the microscopic "peaks" is greater than in the "valleys". The unidirectional mechanism, and thus the difference in etch rates, occurs when the RF power density/gas pressure ratio typically exceeds 10 watts/cm$^3$ torr. Under these conditions, the field driven ions are negligibly scattered by collisions with the dominant neutral species. This unidirectional smoothing mechanism can only occur when the mean free path of the ionic collisions is smaller than the plasma sheath width. Under this condition, the ions experience collisional friction with the dominant neutral species as they are driven across the sheath by the sheath electric field from the plasma body where they are generated to the etching site where they are neutralized. The unidirectional mechanism occurs because the ions do not free fall from the plasma body to the etching site. The ions must be reenergized by the field after each collision, and in the last collision experienced by each ion, the electric field applied on the ion is influenced by the surface shape. The last collision occurs, on the average, a mean free path from the surface and less than a Debye length, beyond which the redistributed plasma charges shield the ion from the sheath electric field. Therefore, under the unidirectional mechanism, the electric field "seen" by the ion during the last free path is greater where a "peak" occurs and less where a "valley" occurs, and thus, greater ion energies are present in the vicinity of a "peak" rather than in the vicinity of a "valley". Because plasma etch rates increase with increasing ion energy, the "peaks" etch faster than the "valleys" due to the higher concentration of ion energy at the "peaks", and thus, smoothing occurs. FIG. 3 is a computer simulated graphical illustration of the unidirectional process over a period of time and shows that the "peaks" etch at a faster rate than the "valleys".

By contrast, operating under plasma parameters which yield conditions where the means free path is greater than the sheath thickness (i.e. negligible numbers of collisions during the journey across the plasma sheath), the ions "free fall" from the plasma body to the etching site, and the resulting ion energy is independent of the shape of the surface on which ions are incident. The ion energy under these conditions is determined only by the sheath voltage (the sheath electric field integrated over the path). Thus, a nonsmoothing omnidirectional process occurs which replicates the surface rather than the unidirectional smoothing process.

Smoothing and polishing in an omnidirectional plasma etching process rather than a unidirectional process occurs from the formation of surface cusps from rounded "hills" on the surface of the substrate prior to processing. FIG. 4 is a computer simulated graphic illustration of the omnidirectional process over a period of time and shows that the amplitude of the cusps relative to valleys is further reduced by the plasma etching process as it progresses until the amplitude of the cusp is zero. The smoothing process by the omnidirectional mechanism occurs when the etching is either dominated by uncharged neutral species, not affected by the sheath electric field or when charged species are driven by fields too weak to overcome their collisional scattering. The omnidirectional etching mechanism is the inverse of "planarization" smoothing which well known for isotropic deposition.

Thus, what has been described is a method and apparatus for smoothing and polishing a substrate by controlled plasma assisted chemical etching.

What is claimed is:

1. A material removal tool for performing unidirectional plasma assisted chemical etching reactions on the surface of a substrate so as to smooth and polish said surface, said tool comprising a reactor having:

means for generating a local plasma etching reaction at a localized region of the substrate, said means including, means for defining a plasma chamber cavity as well as means for supplying a process gas at a pressure to the plasma chamber cavity so as to cause an ionic collision mean free path of ions within a resulting plasma to be smaller than a plasma sheath thickness, and for supplying rf power to said process gas within the plasma chamber cavity so as to cause said gas to disassociate into a reactive plasma;

means for surrounding the outer periphery of the plasma chamber cavity, for suppressing plasma generation outside of said plasma chamber cavity; and means for adjusting the position of said plasma chamber cavity with respect to said substrate so as to adjust the position of the local plasma etching reaction to a different localized region of the substrate.

2. The material removal tool of claim 1, wherein the means for supplying rf power includes a first electrode positioned within the plasma chamber cavity, and a second electrode positioned outside the plasma chamber cavity so that the substrate is positioned between the first and second electrodes so as to complete an electrical circuit for supplying rf power to the reactive gas within the plasma chamber cavity.

3. The material removal tool of claim 1, wherein the means for defining a plasma chamber cavity include a first dielectric insulator.

4. The material removal tool of claim 3, wherein the first dielectric insulator is preferably fabricated from a non-contaminating dielectric material.

5. The material removal tool of claim 1, wherein the means for supplying a reactive gas to the plasma chamber cavity includes an electrically conductive and porous gas diffuser.

6. The material removal tool of claim 1, wherein the means for surrounding the outer periphery of the plasma chamber cavity is a second dielectric insulator extending outward from the first dielectric insulator so as to insulate conductive and proximate surfaces, and thereby facilitate extinction of any plasma outside the plasma chamber cavity.

7. The material removal tool of claim 1, wherein the means for adjusting the position of said plasma chamber cavity with respect to said substrate is an X-Y positioning table.

8. A material removal tool for performing omnidirectional plasma assisted chemical etching reactions on the surface of a substrate so as to smooth and polish said surface, said tool comprising a reactor having:

means for generating a local plasma etching reaction at a localized region of the substrate, said means including, means for defining a plasma chamber cavity as well as means for supplying a process gas at a pressure to the plasma chamber cavity so as to cause the ionic collision mean free path of ions of a resulting plasma to be greater than a plasma sheath thickness, and for supplying rf power to said process gas within the plasma chamber cavity so as to cause said gas to disassociate into a reactive plasma;

means for surrounding the outer periphery of the plasma chamber cavity, for suppressing plasma generation outside of said plasma chamber cavity; and means for adjusting the position of said plasma chamber cavity with respect to said substram so as to adjust the position of the local plasma etching reaction to a different localized region of the substrate;

9. The material removal tool of claim 8, wherein the means for supplying rf power includes a first electrotie positioned within the plasma chamber cavity, and a second electrode positioned outside the plasma chamber cavity so that the substrate is positioned between the first and second electrodes so as to complete an electrical circuit for supplying rf power to the reactive gas within the plasma chamber cavity.

10. The material removal tool of claim 8, wherein the means for defining a plasma chamber cavity include a first dielectric insulator.

11. The material removal tool of claim 10, wherein the first dielectric insulator is preferably fabricated from a non-contaminating dielectric material.

12. The material removal tool of claim 8, wherein the means for supplying a reactive gas to the plasma chamber cavity includes an electrically conductive and porous gas diffuser.

13. The material removal tool of claim 8, wherein the means for surrounding the outer periphery of the plasma chamber cavity is a second dielectric insulator extending outward from the first dielectric insulator so as to insulate conductive and proximate surfaces, and thereby facilitate extinction of any plasma outside the plasma chamber cavity.

14. The material removal tool of claim 8, wherein the means for adjusting the position of said plasma chamber cavity with respect to said substrate is an X-Y positioning table.

15. A material removal tool for performing confined plasma assisted chemical etching reactions on the surface of a substrate so as to smooth and polish said surface, comprising a reactor having:

a housing means for carrying out a local plasma etching reaction including means for controlling the temperature and pressure of the environment within the housing;

a first dielectric insulator positioned within the housing for defining a plasma chamber having a cavity for performing a local plasma etching reaction about a localized region of a substrate;

means for supplying the plasma chamber with a flow of reactive gas including a gas diffuser;

means for providing the reactive gas at pressure greater than 0.1 Torr within the plasma chamber with ff power so as to generate a plasma therein and includes a first electrode positioned within the plasma chamber cavity, an electrically conductive rf gas diffuser, and a second elect:rode positioned outside the plasma chamber cavity so that the substrate is positioned between the first and second electrodes so as to complete an electrical circuit for supplying rf power to the reactive gas within the plasma chamber cavity;

a second dielectric insulator positioned within the housing and around the first dielectric insulator, said second dielectric insulator extending outward from the first dielectric insulator so as to insulate conductive and proximate surfaces, and thereby facilitating extinction of any plasma outside the plasma chamber cavity, and extending downward toward the substrate surface a distance shorter than the first dielectric insulator so as to allow the first dielectric insulator to create a region of high plasma and reactive flow impedance circumferentially adjacent to a site where plasma etching is occurring so that plasma outside the region is extinguished;

means for supporting the substrate; and an X-Y positioning table means for adjusting the position of said substrate surface with respect to the plasma chamber in an orthogonal direction.

16. A method for removing material from the surface of a substrate so as to smooth and polish said surface by a unidirectional mechanism comprising the steps of:

mounting an etchable substrate surface to an electrode;

positioning a plasma etching chamber over the surface of the substrate, the precise position of the chamber dictated by the damage removal desired;

feeding a process gas stream into a feed inlet of an rf driven diffuser in said plasma etching chamber at a pressure so as to cause an ionic mean free path of the ions of a plasma formed from the disassociation of said process gas to be smaller than a plasma sheath thickness;

applying rf power to an electrode within the plasma chamber to create an rf electric field within the plasma chamber for disassociating the process gas into a reactive plasma; and controlling the area of smoothing and polishing by relative movement between the substrate and plasma chamber.

17. The method of claim 27, wherein the pressure of the process gas is greater than 0.1 Torr.

18. A method for removing material from the surface of a substrate so as to smooth and polish said surface by an omnidirectional mechanism comprising the steps of:

mounting an etchable substrate surface to an electrode;

positioning a plasma etching chamber over the surface of the substrate, the precise position of the chamber dictated by the damage removal desired;

feeding a process gas stream into a feed inlet of an rf driven diffuser in said plasma etching chamber at a pressure so as to cause the ionic collision mean free path of ions of a resulting plasma to be greater than a plasma sheath thickness;

applying rf power to an electrode within the plasma chamber to create an rf electric field within the plasma chamber for disassociating the process gas into a reactive plasma; and controlling the area of smoothing and polishing by relative movement between the substrate and plasma chamber.

* * * * *